(12) United States Patent
Ho

(10) Patent No.: US 10,777,109 B2
(45) Date of Patent: Sep. 15, 2020

(54) TROLLEY, AGING TEST APPARATUS AND SYSTEM

(71) Applicants: HKC Corporation Limited, Shenzhen, Guangdong (CN); Chongqing HKC Optoelectronics Technology Co., Ltd., Chongqing (CN)

(72) Inventor: Cheng-Hang Ho, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 8 days.

(21) Appl. No.: 16/330,370

(22) PCT Filed: Jun. 16, 2017

(86) PCT No.: PCT/CN2017/088670
§ 371 (c)(1),
(2) Date: Mar. 4, 2019

(87) PCT Pub. No.: WO2018/205347
PCT Pub. Date: Nov. 15, 2018

(65) Prior Publication Data
US 2020/0202758 A1    Jun. 25, 2020

(30) Foreign Application Priority Data
May 11, 2017    (CN) .......................... 2017 1 0330238

(51) Int. Cl.
*G01R 31/02*    (2006.01)
*G09G 3/00*    (2006.01)
(Continued)

(52) U.S. Cl.
CPC .......... *G09G 3/006* (2013.01); *B65G 1/0492* (2013.01); *G01R 19/0092* (2013.01);
(Continued)

(58) Field of Classification Search
CPC .... G01R 31/50; G01R 19/0092; G01R 31/28; G01R 31/52; G01R 31/001; G01R 31/002; G01R 31/40; G01R 17/02
(Continued)

(56) References Cited

U.S. PATENT DOCUMENTS

| 2010/0287697 A1* | 11/2010 | Ahlman | A61B 6/0442 5/81.1 R |
| 2012/0049475 A1* | 3/2012 | Jensen | B62B 5/025 280/79.11 |
| 2013/0209947 A1* | 8/2013 | Moller | C21D 9/0018 432/1 |

FOREIGN PATENT DOCUMENTS

| CN | 201203725 Y | 3/2009 |
| CN | 201449444 U | 5/2010 |
| CN | 103268030 A | 8/2013 |

OTHER PUBLICATIONS

International search report of PCT Patent Application No. PCT/CN2017/088670 dated Feb. 9, 2018.

* cited by examiner

*Primary Examiner* — Raul J Rios Russo

(57) ABSTRACT

Disclosed is a trolley, including: a trolley body, comprising a first support plate, and a second support plate perpendicular to the first support plate and fixedly defined on the upper surface of the first support plate; a plurality of carrying platforms, being perpendicular to the second support plate and symmetrically defined on two sides of the second support plate, the carrying platforms located on the same side of the second support plate being arranged in a row and equally spaced, to allow one end of the display panel to abut against the carrying platform, and the other end abut against (Continued)

the second support plate, for the display panel to be placed obliquely. Disclosed are also an aging test apparatus and system.

20 Claims, 3 Drawing Sheets

(51) Int. Cl.
*B65G 1/04* (2006.01)
*G01R 19/00* (2006.01)
*G01R 31/50* (2020.01)
*G01R 31/28* (2006.01)
*G01R 31/00* (2006.01)
*G01R 31/52* (2020.01)
G01R 17/02 (2006.01)
G01R 31/40 (2020.01)

(52) U.S. Cl.
CPC ......... *G01R 31/001* (2013.01); *G01R 31/002* (2013.01); *G01R 31/28* (2013.01); *G01R 31/50* (2020.01); *G01R 31/52* (2020.01); *G01R 17/02* (2013.01); *G01R 31/40* (2013.01)

(58) Field of Classification Search
USPC .......... 324/71, 378, 403, 415, 425, 500, 537
See application file for complete search history.

TROLLEY, AGING TEST APPARATUS AND SYSTEM

FIELD

The present disclosure relates to the field of display panel technology, and more particularly relates to a trolley, an aging test apparatus, and an aging test system.

BACKGROUND

Currently, most of aging test apparatus for testing display panels are window-type, users can observe the testing result directly via the window of the apparatus. However, only a small number of display panels can be placed in this kind of apparatus to be tested for each test. There are also a small number of aging test apparatus which are drawer-type, and much more number of display panels can be placed in the apparatus to be tested for each test. However, the drawers of the apparatus should be pulled out for users to observe the test results, during which the display panels are power-off, thus an aging abnormality of the test can no longer appears.

In view of this, there is an urgent need of a trolley, an aging test apparatus, and an aging test system, to increase the number of display panels to be received for each test, and is convenient for user to observe the aging abnormality during test.

SUMMARY

The present disclosure provides a trolley and an aging test apparatus, which can increase the number of display panels to be received, and is convenient for user to observe the aging abnormality.

In one embodiment, the present disclosure provides a trolley, configured to carry a display panel. The trolley includes a trolley body, a first support plate, and a second support plate perpendicular to the first support plate and fixedly defined on the upper surface of the first support plate; a plurality of carrying platforms, perpendicular to the second support plate and symmetrically defined on two sides of the second support plate, the carrying platforms located on the same side of the second support plate arranged in a row and equally spaced, to allow one end of the display panel to abut against the carrying platform, and the other end abut against the second support plate for the display panel to be placed obliquely; a first placement area and a second placement area, defined between the lowest carrying platforms and the first support plate; a power supplier, defined in the first placement area, configured to provide test power for the display panel; a signal generator, defined in the second placement area, configured to provide test signal source for the display panel; a wheel, defined on the lower surface of the first support plate.

In another embodiment, the present disclosure provides an aging test apparatus. The aging test apparatus includes: a trolley, configured to carry a display panel; a furnace body, the furnace body being defined a cavity therein for receiving the trolley; a door body, movably defined on the furnace body, the door body covering the furnace body for an aging test to be carried out when the trolley carried with the display panel is disposed in the cavity of the furnace body; the trolley includes: a trolley body, a first support plate, and a second support plate perpendicular to the first support plate and fixedly defined on the upper surface of the first support plate; a plurality of carrying platforms, perpendicular to the second support plate and symmetrically defined on two sides of the second support plate, the carrying platforms located on the same side of the second support plate arranged in a row and equally spaced, to allow one end of the display panel to abut against the carrying platform, and the other end abut against the second support plate for the display panel to be placed obliquely; a first placement area and a second placement area, defined between the lowest carrying platforms and the first support plate; a power supplier, defined in the first placement area, configured to provide test power for the display panel; a signal generator, defined in the second placement area, configured to provide test signal source for the display panel; and a wheel, defined on the lower surface of the first support plate.

In another embodiment, the present disclosure provides an aging test system. The aging test system includes: an aging test apparatus; a control unit, electrically connected to the aging test apparatus, for controlling the aging test apparatus to perform aging test; the aging test apparatus includes: a trolley, configured to carry a display panel; a furnace body, the furnace body being defined a cavity therein for receiving the trolley; a door body, movably defined on the furnace body, the door body covering the furnace body for an aging test to be carried out when the trolley carried with the display panel is disposed in the cavity of the furnace body; the trolley includes: a trolley body, a first support plate, and a second support plate perpendicular to the first support plate and fixedly defined on the upper surface of the first support plate; a plurality of carrying platforms, perpendicular to the second support plate and symmetrically defined on two sides of the second support plate, the carrying platforms located on the same side of the second support plate arranged in a row and equally spaced, to allow one end of the display panel to abut against the carrying platform, and the other end abut against the second support plate for the display panel to be placed obliquely; a first placement area and a second placement area, defined between the lowest carrying platforms and the first support plate; a power supplier, defined in the first placement area; a signal generator, defined in the second placement area; and a wheel, defined on the lower surface of the first support plate.

In the exemplary embodiment, the trolley, the aging test apparatus, and the aging test system, by symmetrically defining a plurality of carrying platforms on the two sides of the second support plate, and the carrying platforms located on the same side of the second support plate being arranged in a row and equally spaced, allow the display panel to rest on the second support plate via the carrying platform. Because both sides of the trolley are allowed to place display panels, the number of the display panels to be received is increased. In addition, the trolley is also provided with a power supplier and a signal generator, by disposing the power supply and signal generator on the trolley, allowing the display panel always being in a test status, so that the aging abnormality of the display panel can be observed at anytime and anywhere.

BRIEF DESCRIPTION OF THE DRAWINGS

In order to more clearly illustrate the embodiments of the present disclosure or the technical solutions in the prior art, the drawings used in the embodiments or the prior art description will be briefly introduced below. Obviously, the drawings in the following description are merely some of the embodiments of the present disclosure, and those skilled in the art can obtain other drawings according to the structures shown in the drawings without any creative work.

DETAILED DESCRIPTION OF THE EMBODIMENTS

The technical solutions in the embodiments of the present disclosure are clearly and completely described in the following with reference to the accompanying drawings in the embodiments of the present disclosure. It will be appreciated that the described embodiments are merely part of the embodiments of the present disclosure, rather than all the embodiments. Based on the embodiments in the present disclosure, all other embodiments obtained by those skilled in the art without creative efforts are within the scope of the present disclosure.

Figure 1:
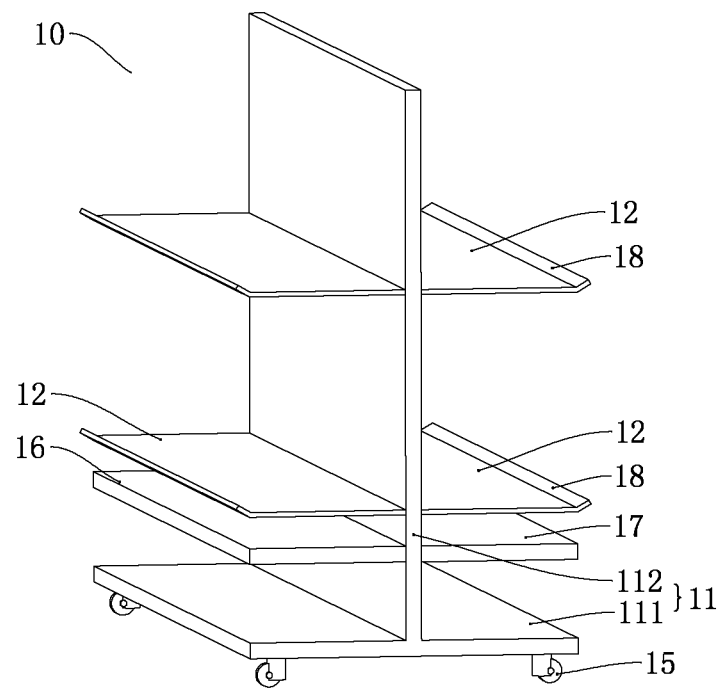
FIG. 1 is a structure diagram of a trolley of an embodiment according to the present disclosure.
Figure 2:
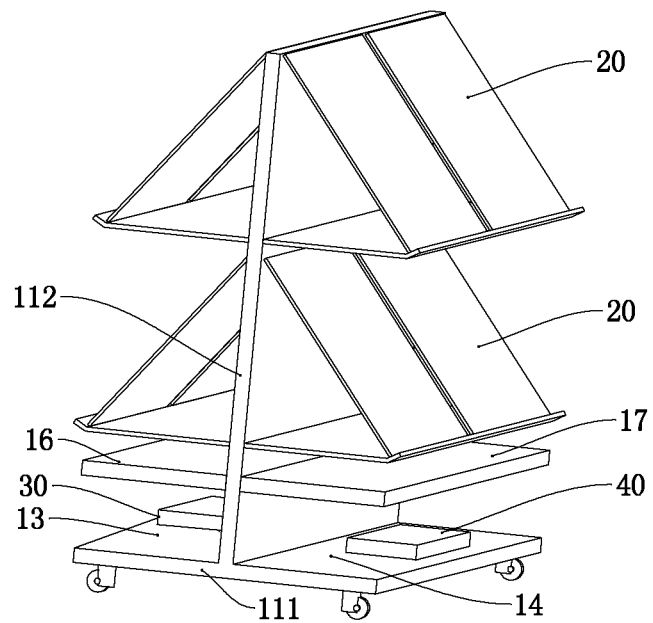
FIG. 2 is a structure diagram of a trolley placed with display panels of an embodiment according to the present disclosure.

Referring to FIG. 1 and FIG. 2, the trolley 10 includes a trolley body 11, a plurality of carrying platforms 12, a first placement are 13, a second placement area 14 and a wheel 15. Specifically, the trolley body 11 includes a first support plate 111, and a second support plate 112 perpendicular to the first support plate 111 and fixedly defined on the upper surface of the first support plate 111. The plurality of carrying platforms 12, perpendicular to the second support plate 112 and symmetrically defined on two sides of the second support plate 112, the carrying platforms 12 located on the same side of the second support plate 112 arranged in a row and equally spaced, to allow one end of the display panel 20 to abut against the carrying platform 12, and the other end abut against the second support plate 112 to be placed obliquely. The first placement area 13 and a second placement area 14 are both defined between the lowest carrying platforms 12 and the first support plate 111. a power supplier 30, defined in the first placement area 13, configured to provide test power for the display panel; a signal generator 40, defined in the second placement area 14, configured to provide test signal source for the display panel; and a wheel 15, defined on the lower surface of the first support plate 111.

One side of the second support plate 112 may be defined with a plurality of carrying platforms 12, such as two carrying platforms 12 or three carrying platforms 12. The specific number of the carrying platforms 12 is not to be limited herein. To lean the display panel 20 against the trolley 10, in one embodiment of the present disclosure, one side of the second support plate 112 is defined with the plurality of carrying platforms 12, the adjacent carrying platforms 12 are equally spaced. In some embodiments, the interval between carrying platforms 12 is based on a display panel that is compatible with a maximum size, such as 60 inches, such that the corresponding display panel can be tilted against the second support plate 112 by the carrying platforms 12.

The first placement area 13 and the second placement area 14 are both defined between the lowest carrying platforms 12 and the first support plate 111, the first placement area 13 is configured for placing the power supplier 30, and the second placement area 14 is configured for placing the signal generator 40. The power supplier 30 is configured to provide test signal source for the display panel 20, and the signal generator 40 is configured to provide test signal source for the display panel 20. In some embodiments, for example, a first partition plate 16 and a second partition plate 17 perpendicular to the second support plate 112 are symmetrically defined on the two sides of the second support plate 112. The first partition plate 16 and the second partition plate 17 are defined between the lowest carrying platforms 12 and the first support plate 111, the first placement area 13 is defined between the first support plate 111 and the first partition plate 16, the second placement area 14 is defined between the first support plate 111 and the second partition plate 17, and the first partition plate 16 and the second partition plate 17 both form preset gap together with the lowest carrying platforms 12. By the setting of the preset gap, it is possible to provide space for the connection wires of the power supplier 30 and the signal generator 40, to prevent the scattered placement of the connection wires. In some embodiments, the specific positions of the first placement area 13 and the second placement area 14 are set according to the size of the power supplier 30 and the signal generator 40. For example, the first placement area 13 and the second placement area 14 are symmetrically arranged on the two sides of the second support plate 112, that is, the power supplier 30 and the signal generator 40 are arranged on the two sides of the second support plate 112, or the first placement area 13 and the second placement area 14 are arranged on one side of the second support plate 112, that is, the power supplier 30 and the signal generator 40 are arranged on the same side of the second support plate 112, which are not to be limited herein. By placing the power supplier 30 and the signal generator 40 both on the trolley 10, the display panel 20 is always in a test status, so as to observe the aging abnormality of the display panel 20 at anytime and anywhere.

The trolley 10 of the embodiment according to the present disclosure is provided with a plurality of carrying platforms 12 which are symmetrically arranged on the two sides of the second support plate 112, and the carrying platforms located on the same side of the second support plate 112 are arranged in a row and equally spaced, so as to allow the display panel 20 to rest on the second support plate 112 via the carrying platform 12. Both sides of the trolley is configured to receive display panels 20, increasing the number of the display panels 20 to be received. In addition, the trolley 10 is also provided with the power supplier 30 and the signal generator 40. By disposing the power supplier 30 and the signal generator 40 on the trolley 10, the display panel 20 is always in a test status, so as to observe the aging abnormality of the display panel 20 at anytime and anywhere.

Further, each side of the second support plate 112 is defined with two carrying platforms 12.

Specifically, in one embodiment of the present disclosure, each side of the second support plate 112 is defined with two carrying platforms 12, and each carrying platform 12 is configured for receiving at least one display panel 20, such as a 60-inch display panel.

Further, in some embodiments, each carrying platform 12 is defined to place two display panels 20, and the two display panels 20 do not overlap with each other.

Specifically, in one embodiment of the present disclosure, each carrying platform 12 is defined to place two display panels 20, such as two 60-inch display panels, and the two display panels 20 do not overlap with each other. In the case that each side of the second support plate 112 of the trolley 10 provided in embodiments according to the present disclosure is provided with two carrying platforms 12, and each carrying platform 12 is configured to receive two 60-inch display panels 20, the trolley 10 is able to receive a total of eight 60-inch display panels 20. It should be understood that, if display panels of different sizes, such as between 21.5-inch and 60-inch, are disposed on the trolley 10 without overlapping with each other, the actual number of display panels disposed on the trolley 10 are more than eight. Therefore, the trolley 10 is able to receive at least eight display panels 20, namely at least eight display panels 20 can be received by the trolley 10 in a single time.

Further, an anti-slip structure is defined at the edge of each carrying platform 12 away from the second support plate 112 for preventing the display panel 20 from slipping off.

In order to prevent the display panel 20 from slipping off the carrying platform 12, in one embodiment of the present disclosure, an anti-slip structure is defined at the edge of each carrying platform 12 away from the second support plate 112 for preventing the display panel 20 from slipping off, so as to reduce fragmentation loss.

Further, the anti-slip structure is a bent edge 18, and the plane where the bent edge 18 is located and the plane where the carrying platform 12 is located forms an obtuse angle therebetween.

Specifically, in one embodiment of the present disclosure, the anti-slip structure is a bent edge 18, and the plane where the bent edge 18 is located and the plane where the carrying platform 12 is located forms an obtuse angle therebetween. By the arrangement of the bent edge 18, when the display panel 20 is placed on the trolley 10, one end of the display panel 20 abuts against the boundary between the bent edge 18 and the carrying platform 12, the other end abuts against the second support plate 112 and rests on the second support plate 112, so as to allow the display panel 20 to be safely placed on the trolley 10.

Further, the bent edge 18 is integrally formed with the carrying platform 12.

Specifically, in one embodiment of the present disclosure, the bent edge 18 is integrally formed with the carrying platform 12, thereby reducing the additional manufacturing process and installation operation of the bent edge 18. It should be understood that, in some embodiments, the bent edge 18 completely covers the edge position of the carrying platform 12 away from the second support plate 112, that is, covering the entire side of the carrying platform 12 away from the second support plate 112; of course, in some other embodiments, the bent edge 18 is arranged in interval at the edge position of the carrying platform 12 away from the second support plate 112, which are not to be detailed herein.

Further, the anti-slip structure includes a plurality of polyurethane blocks arranged in interval at the edge position of the carrying platform 12 away from the second support plate 112.

Specifically, in some other embodiments, the anti-slip structure includes a plurality of polyurethane blocks arranged in interval at the edge position of the carrying platform 12 away from the second support plate 112 (not shown in drawings). The polyurethane blocks are fixed on the carrying platform 12 by pasting. By arrangement of the polyurethane blocks, when the display panel 20 is placed on the trolley 10, one end of the display panel abuts against the polyurethane, the other end abuts against the second support plate 112 and rests on the second support plate 112, so as to prevent the display panel 20 from slipping off, reducing fragmentation loss. And the polyurethane block has a little softness, when the display panel 20 is in contact with the polyurethane block, the surface of the display panel 20 may be prevented from being scratched, thereby protecting the product quality of the display panel 20.

Figure 3:
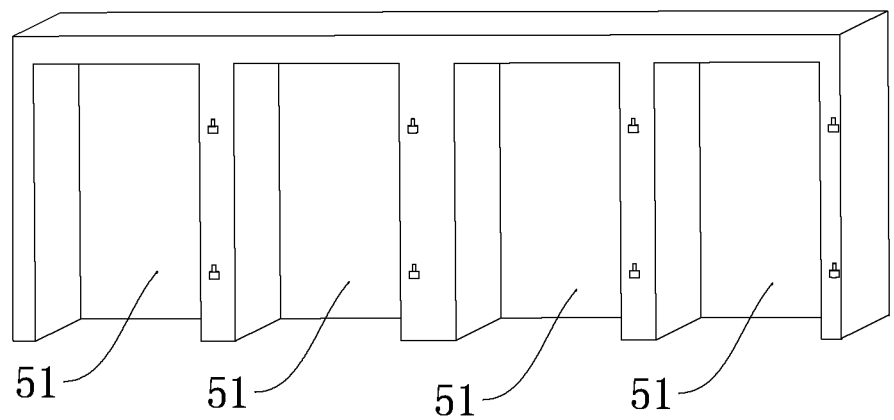
FIG. 3 is a structure diagram of a furnace body of an embodiment according to the present disclosure.
Figure 4:
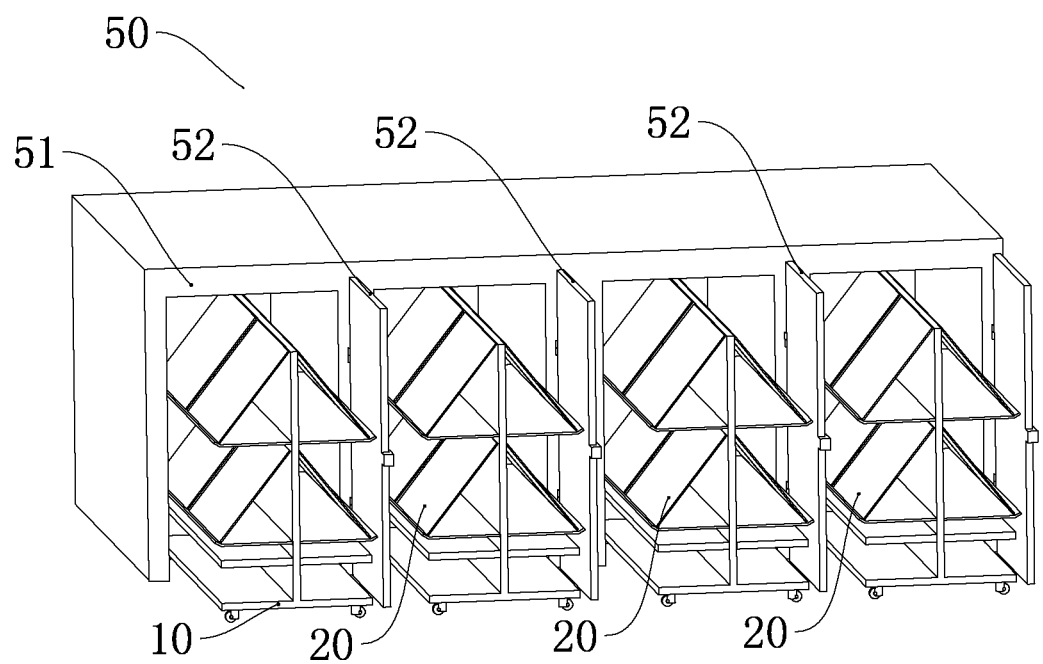
FIG. 4 is a structure diagram of an aging test apparatus of an embodiment according to the present disclosure.

Referring to FIG. 3 and FIG. 4, the aging test apparatus 50 includes a trolley 10 as described above, configured to carry a display panel; a furnace body 51, the furnace body 51 being defined a cavity therein for receiving the trolley 10; a door body 52, movably defined on the furnace body 51, the door body 52 covering the furnace body 51 for an aging test to be carried out when the trolley 10 carried with the display panel 20 is disposed in the cavity of the furnace body 51.

In some embodiments, the display panel 20 is, for example, a twisted nematic panel, a plane conversion screen, a multi-quadrant vertical alignment panel, an LCD (Liquid Crystal Display) panel, an OLED (Organic Light Emitting Diode) panel, a QLED (Quantum Dot Light Emitting Diodes) panel, a curved display panel and so on.

Figure 5:
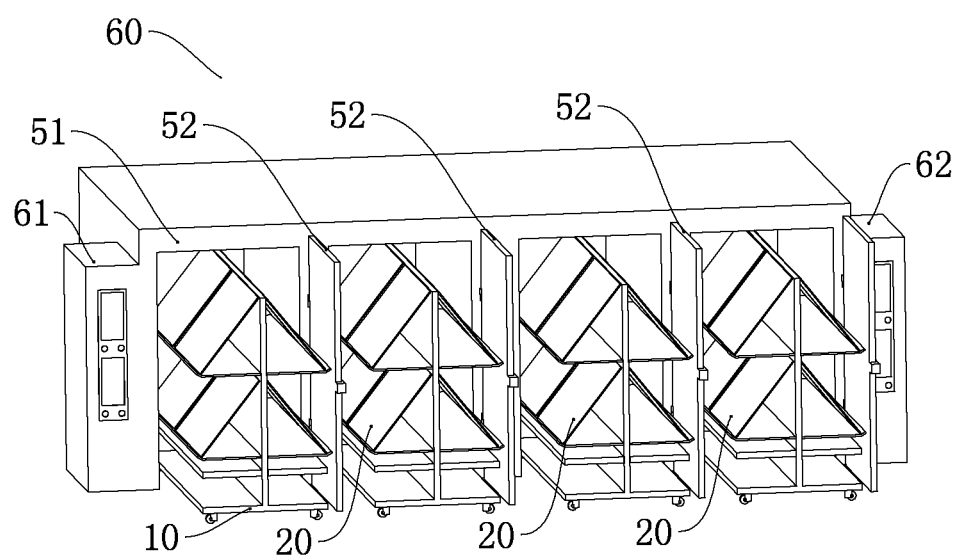
FIG. 5 is a structure diagram of an aging test system of an embodiment according to the present disclosure.

Referring to FIG. 5, the aging test system 60 includes the aging test apparatus 50 described above, a control unit (not labeled in drawings), electrically connected to the aging test apparatus 50, to control the aging test apparatus 50 to perform an aging test.

Specifically, the aging test apparatus 50 includes a plurality of furnace bodies 51 disposed adjacent to each other, to meet requirements of aging test of the display panel 20. The control unit includes a first control unit 61 and a second control unit 62, the first control unit 61 and the second control unit 62 are respectively defined on two sides of the furnace bodies 51. The first control unit 61 is electrically connected to a portion of the furnace bodies 51 adjacent to the first control unit 61, to control the aging test of the portion of the furnace bodies 51 adjacent to the first control unit 61; the second control unit 62 is electrically connected to the remaining portion of the furnace bodies 51, to control the aging test of the remaining portion of the furnace bodies 51. In some embodiments, the aging test apparatus 50 includes four adjacent furnace bodies 51, and the first control unit 61 is electrically connected to two furnace bodies 51 adjacent thereto, to control the aging test of the two furnace bodies 51 adjacent thereto, the second control unit 62 is electrically connected to the two remaining furnace bodies 51, to control the aging test of the two remaining furnace bodies 51.

It should be noted that, in order to meet requirements of different aging test temperature, in some embodiments, each furnace body 51 is independently controlled by a corresponding control unit. Since the independent temperature control of each furnace body 51 is a common knowledge to those skilled in the art, which are not to be detailed herein.

In embodiments of the present disclosure, each trolley 10 as described above receives at least eight display panels, and the furnace body 51 of the aging test apparatus 50 is defined with the cavity for receiving the trolley 10. When performing the aging test, the trolley 10 carried with the display panels 20 is disposed in the cavity of the furnace body 51, the door body 52 is covered with the furnace body 51, then the corresponding control unit is controlled for the aging test. Both sides of the trolley is configured to receive display panels 20, so as to increase the number of the display panels 20 to be received, and the number of the display panels 20 in single aging test performed by the aging test apparatus 50, thereby improving the aging efficiency. In addition, the trolley 10 is also provided with the power supplier 30 and the signal generator 40. When observing the aging abnormality, the trolley 10 is removed from the furnace body 51, and the display panel 20 is maintained in a test status by the power supplier 30 and the signal generator 40 on the trolley 10, so that after the trolley 10 is removed from the furnace body 51, it is convenient to observe the aging abnormality of the display panel 20.

It should be noted that, in above embodiments, the description of each embodiment has its respective focus. For the parts not detailed in one embodiment, please refer to the related descriptions of other embodiments.

The foregoing description merely portrays some illustrative embodiments in accordance with the disclosure and therefore is not intended to limit the patentable scope of the disclosure. Any equivalent structure or flow transformations that are made taking advantage of the specification and accompanying drawings of the disclosure and any direct or indirect applications thereof in other related technical fields shall all fall in the scope of protection of the disclosure.

What is claimed is:

1. A trolley, configured to carry a display panel, comprising:
   a trolley body, comprising a first support plate, and a second support plate perpendicular to the first support plate and fixedly defined on the upper surface of the first support plate;
   a plurality of carrying platforms, being perpendicular to the second support plate and symmetrically defined on two sides of the second support plate, the carrying platforms located on the same side of the second support plate being arranged in a row and equally spaced, to allow one end of the display panel to abut against the carrying platform, and the other end abut against the second support plate, for the display panel to be placed obliquely;
   a first placement area and a second placement area, defined between the lowest carrying platforms and the first support plate;
   a power supplier, defined in the first placement area;
   a signal generator, defined in the second placement area; and
   a wheel, defined on the lower surface of the first support plate.

2. The trolley of claim 1, wherein, each side of the second support plate is defined with two carrying platforms.

3. The trolley of claim 1, wherein, each carrying platform is defined to place two display panels, and the two display panels do not overlapping with each other.

4. The trolley of claim 3, wherein, an anti-slip structure is defined at the edge of each carrying platform away from the second support plate for preventing the display panel from slipping off.

5. The trolley of claim 4, wherein, the anti-slip structure is a bent edge, and the plane where the bent edge is located and the plane where the carrying platform is located forms an obtuse angle therebetween.

6. The trolley of claim 5, wherein, the bent edge is integrally formed with the carrying platform.

7. The trolley of claim 4, wherein, the anti-slip structure comprises a plurality of polyurethane blocks defined in interval at the edge of the carrying platform away from the second support plate.

8. The trolley of claim 7, wherein, the polyurethane blocks are fixed on the carrying platform by pasting.

9. The trolley of claim 1, wherein, the first placement area and the second placement area are symmetrically defined on two sides of the second support plate.

10. An aging test apparatus, comprising:
    a trolley, configured to carry a display panel;
    a furnace body, the furnace body being defined a cavity therein for receiving the trolley;
    a door body, movably defined on the furnace body, the door body covering the furnace body for an aging test to be carried out when the trolley carried with the display panel is disposed in the cavity of the furnace body;
    the trolley comprising:
    a trolley body, comprising a first support plate, and a second support plate perpendicular to the first support plate and fixedly defined on the upper surface of the first support plate;
    a plurality of carrying platforms, being perpendicular to the second support plate and symmetrically defined on two sides of the second support plate, the carrying platforms located on the same side of the second support plate being arranged in a row and equally spaced, to allow one end of the display panel to abut against the carrying platform, and the other end abut against the second support plate, for the display panel to be placed obliquely;
    a first placement area and a second placement area, defined between the lowest carrying platforms and the first support plate;
    a power supplier, defined in the first placement area;
    a signal generator, defined in the second placement area;
    a wheel, defined on the lower surface of the first support plate.

11. The aging test apparatus of claim 10, wherein, each side of the second support plate is defined with two carrying platforms.

12. The aging test apparatus of claim 10, wherein, each carrying platform is defined to place two display panels, and the two display panels do not overlapping with each other.

13. The aging test apparatus of claim 12, wherein, an anti-slip structure is defined at the edge of each carrying platform away from the second support plate for preventing the display panel from slipping off.

14. The aging test apparatus of claim 13, wherein, the anti-slip structure is a bent edge, and the plane where the bent edge is located and the plane where the carrying platform is located forms an obtuse angle therebetween.

15. The aging test apparatus of claim 14, wherein, the bent edge is integrally formed with the carrying platform.

16. The aging test apparatus of claim 13, wherein, the anti-slip structure comprises a plurality of polyurethane blocks defined in interval at the edge of the carrying platform away from the second support plate.

17. The aging test apparatus of claim 16, wherein, the polyurethane blocks are fixed on the carrying platform by pasting.

18. The aging test apparatus of claim 10, wherein, the first placement area and the second placement area are symmetrically defined on two sides of the second support plate.

19. An aging test system, comprising:
    an aging test apparatus;
    a control unit, electrically connected to the aging test apparatus, for controlling the aging test apparatus to perform aging test;
    the aging test apparatus comprising:
    a trolley, configured to carry a display panel;
    a furnace body, the furnace body being defined a cavity therein for receiving the trolley;
    a door body, movably defined on the furnace body, the door body covering the furnace body for an aging test to be carried out when the trolley carried with the display panel is disposed in the cavity of the furnace body;

the trolley comprising:
a trolley body, comprising a first support plate, and a second support plate perpendicular to the first support plate and fixedly defined on the upper surface of the first support plate;
a plurality of carrying platforms, being perpendicular to the second support plate and symmetrically defined on two sides of the second support plate, the carrying platforms located on the same side of the second support plate being arranged in a row and equally spaced, to allow one end of the display panel to abut against the carrying platform, and the other end abut against the second support plate, for the display panel to be placed obliquely;
a first placement area and a second placement area, defined between the lowest carrying platforms and the first support plate;
a power supplier, defined in the first placement area;
a signal generator, defined in the second placement area;
a wheel, defined on the lower surface of the first support plate.

20. The aging test system of claim 19, wherein, the aging test apparatus comprises a plurality of furnace bodies adjacent to each other, the control unit comprises a first control unit and a second control unit, the first control unit and the second control unit are respectively defined on two sides of the furnace body, the first control unit is electrically connected to a portion of the furnace bodies which are adjacent to the first control unit, to control the aging test of the portion of the furnace bodies adjacent thereto; the second control unit is electrically connected to the remaining portion of the furnace bodies, to control the aging test of the remaining portion of the furnace bodies.

* * * * *